(12) United States Patent
Dornbusch

(10) Patent No.: US 7,471,134 B2
(45) Date of Patent: Dec. 30, 2008

(54) MIXER WITH CLOCK RESYNCHRONIZATION AND METHOD THEREFOR

(75) Inventor: Andrew W. Dornbusch, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 682 days.

(21) Appl. No.: 10/853,444

(22) Filed: May 25, 2004

(65) Prior Publication Data

US 2005/0265480 A1   Dec. 1, 2005

(51) Int. Cl.
*H04B 1/26* (2006.01)

(52) U.S. Cl. .................. 327/356; 455/323; 455/326; 375/316; 375/332

(58) Field of Classification Search .................. 327/113, 327/355–361; 455/323, 333, 326; 375/308, 375/332
See application file for complete search history.

(56) References Cited

U.S. PATENT DOCUMENTS

| 5,221,926 | A | 6/1993 | Jackson |
| 5,610,942 | A | 3/1997 | Chen et al. |
| 5,999,804 | A | 12/1999 | Forgues |
| 6,035,186 | A | 3/2000 | Moore et al. |
| 6,049,573 | A | 4/2000 | Song |
| 6,104,227 | A | 8/2000 | Durec et al. |
| 6,122,497 | A | 9/2000 | Gilbert |
| 6,269,127 | B1 * | 7/2001 | Richards ........... 375/282 |
| 6,308,058 | B1 * | 10/2001 | Souetinov et al. ...... 455/326 |
| 6,529,100 | B1 | 3/2003 | Okanobu |
| 6,826,393 | B1 | 11/2004 | Komurasaki et al. |
| 6,999,747 | B2 * | 2/2006 | Su ..................... 455/324 |
| 7,042,272 | B2 | 5/2006 | Dornbusch |
| 7,127,227 | B2 * | 10/2006 | Takahiko ............ 455/313 |
| 7,130,604 | B1 * | 10/2006 | Wong et al. ........... 455/302 |
| 7,184,737 | B2 | 2/2007 | Liu |
| 7,190,943 | B2 * | 3/2007 | Davis ................. 455/313 |
| 2003/0071925 | A1 | 4/2003 | Kanno et al. |
| 2004/0052300 | A1 | 3/2004 | Lopez-Estrada |
| 2005/0175132 | A1 | 8/2005 | Yang |
| 2005/0220224 | A1 | 10/2005 | Dornbusch |
| 2005/0239430 | A1 * | 10/2005 | Shah .................. 455/326 |

(Continued)

OTHER PUBLICATIONS

Wiegerink, Remco J., "Synthesis of MOS translinear circuits," The Kluwer International Series in Engineering and COmputer Science, vol. 246, pp. 78-85, Aug. 1993.

(Continued)

*Primary Examiner*—Lincoln Donovan
*Assistant Examiner*—Patrick O'Neill
(74) *Attorney, Agent, or Firm*—Larson Newman; Abel & Polansky LLP

(57) ABSTRACT

A mixer (114) includes a phase clock generator (404), a latch (420), and a multiplier (118). The phase clock generator (404) provides a plurality of phase clock signals. The latch (420) is coupled to the phase clock generator (404) via a first plurality of conductors (410) and provides a plurality of resynchronized phase clock signals. The multiplier (118) is coupled to the latch (420) via a second plurality of conductors (430) and mixes an input signal using the plurality of resynchronized phase clock signals to provide a mixed output signal. The second plurality of conductors (430) is characterized as having a lower end-to-end impedance than an end-to-end impedance of the first plurality of conductors (410).

17 Claims, 7 Drawing Sheets

U.S. PATENT DOCUMENTS

2005/0266821 A1   12/2005   Dornbusch

OTHER PUBLICATIONS

"SAW Components," EPCOS AG Data Sheet Y 7103 L, Surface Acoustic Wave Components Division OFW E UE, 6 pp., Jun. 14, 2000.

Terrovitis, M. T. and Meyer, R. G., "Noise and Intermodulation Distortion in Current-Commutating CMOS Mixers," Berkeley Wireless Research Center Retreat, 3 pp., Jun. 1999.

Karvonen, S. et al., "A Low Noise Quadrature Subsampling Mixer," Proceedings of IEEE International Symposium of Circuits and Systems (ISCAS2001), Darling Harbour, Sydney, Australia, IV-790-IV-793, Sep. 2001.

Lee, Kyeongho, et al, "a Single-Chip 2.4-GHz Direct-Conversion CMOS Receiver for Wireless Local Loop using Multiphase Reduced Frequency Conversion Technique," IEEE Journal of Solid-State Circuits, vol. 36, No. 5, pp. 800-809, May 2001.

Hornak, Thomas et al., "An Image-Rejecting Mixer and Vector Filter with 55-dB Image Rejection over Process, Temperature, and Transistor Mismatch," IEEE Journal of Solid-State Circuits, vol. 36, No. 1, pp. 23-33, Jan. 2001.

Hornak, Tom, "Using polyphase filters as image attenuators," RF Signal Processing, [online] www.rfdesign.com, pp. 26-34, Jun. 2001.

[[Actions on the Merits by the U.S.P.T.O. as of Sep. 19, 2007, 2 pages.]].

Silicon Laboratories, "Silicon Laboratories Introduces Industry's First 100% CMOS Satellite Radio Tuner," News Release, Austin, TX, Oct. 27, 2003, 3 pages.

\* cited by examiner

MIXER WITH CLOCK RESYNCHRONIZATION AND METHOD THEREFOR

CROSS REFERENCE TO RELATED APPLICATIONS

Related subject matter is contained in the following copending applications:
1. application Ser. No. 10/814,615, filed on Mar. 31, 2004, entitled "Polyphase Filter with Passband Compensation and Method Therefor" invented by Andrew W. Dornbusch and assigned to the assignee hereof.
2. application Ser. No. 10/853,633, filed of even date herewith, entitled "Transconductance Amplifier with Substantially Constant Resistance and Mixer Using Same" invented by Andrew W. Dornbusch and assigned to the assignee hereof.
3. application Ser. No. 10/853,473, filed of even date herewith, entitled "Low Distortion Quadrature Mixer and Method Therefor" invented by Andrew W. Dornbusch and assigned to the assignee hereof.

TECHNICAL FIELD

The present invention generally relates to frequency conversion circuits, and more particularly to mixers.

BACKGROUND

Radio frequency (RF) receivers are used in a wide variety of applications such as television, cellular telephones, pagers, global positioning system (GPS) receivers, cable modems, cordless phones, satellite radio receivers, and the like. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted back down to baseband for further processing. Thus a superheterodyne receiver requires one or more mixing steps.

One well-known problem with the mixing process is that it creates image signals. For some RF systems the level of the image signal is small enough so that designers can rely on the attenuation characteristics of the IF bandpass filter alone to reject image signals. However for other systems the attenuation of the IF bandpass filter is not sufficient. For example satellite radio uses a 2.3 GHz carrier frequency. Each channel has a baseband spectrum from 1 megahertz (MHz) to about 13 MHz, and the adjacent signal spectra can create large image signals. In these systems additional image rejection filtering is required to maintain a sufficient signal-to-noise ratio (SNR) in the desired signal.

One known image signal rejection technique uses a polyphase filter and is performed in two stages. First the input signal is mixed with two separate local oscillator signals that are in quadrature with each other (that is, separated in phase by ninety degrees). Then the two output signals are passed through a phase delay filter to delay the wanted component a certain number of degrees. Then the signals are summed, and the combination of the phase shifts from the mixing process and the phase delay filter causes the desired signal to be passed and its image to be cancelled.

An image rejection mixer can be built to cancel the image frequency. One common approach is to separate two phases of a signal such as the in-phase (I) and quadrature (Q) components, and process these signals using a single phase filter section before recombining the components into an output signal. An alternate approach uses a polyphase filter that processes more than one phase of an input signal. Polyphase filters have been used occasionally in radio applications for many years, and are useful in single sideband (SSB) applications due to their asymmetric frequency characteristics, which can be used for rejection of the unwanted sideband.

In an image-reject mixer, the primary limitations to the potential image rejection are mixer gain mismatching, mixer phase clock accuracy, and polyphase filter rejection. Independent of any mixer gain error and polyphase mixer rejection, a phase clock error of only 0.02 radians (an edge delay of 31 picoseconds at 100 megahertz (MHz) clock rates) limits image rejection to −40 decibels (dB). Thus phase clock accuracy is especially important in providing good image rejection. Moreover several factors present in integrated circuits contribute to phase clock error, including uneven phase clock signal routing lengths, unequal loading on the phase clocks, and non-matching generation logic. New designs that can be implemented in low-cost complementary metal-oxide-semiconductor (CMOS) integrated circuits that have high phase clock accuracy are needed.

BRIEF SUMMARY

In one form a mixer comprises a phase clock generator, a latch, and a multiplier. The phase clock generator provides a plurality of phase clock signals. The latch is coupled to the phase clock generator via a first plurality of conductors and provides a plurality of resynchronized phase clock signals. The multiplier is coupled to the latch via a second plurality of conductors and mixes an input signal using the plurality of resynchronized phase clock signals to provide a mixed output signal. The second plurality of conductors is characterized as having a lower end-to-end impedance than an end-to-end impedance of the first plurality of conductors.

In another form a mixer includes a phase clock generator, a first plurality of conductors, a latch, a second plurality of conductors, and a multiplier. The phase clock generator has an input terminal for receiving a clock signal and an output terminal for providing a plurality of phase clock signals in response to the clock signal. The first plurality of conductors conducts the plurality of phase clock signals. The latch has a plurality of data input terminals coupled to corresponding ones of the first plurality of conductors, a clock input terminal for receiving the clock signal, and a plurality of output terminals for providing a plurality of resynchronized phase clock signals. The second plurality of conductors conducts the plurality of resynchronized phase clock signals. The second plurality of conductors is characterized as having a lower impedance than the first plurality of conductors. The multiplier has a first input terminal for receiving an input signal, a plurality of second input terminals for receiving the plurality of resynchronized phase clock signals, and an output terminal for providing a mixed output signal.

In another form a mixer includes a local oscillator and a multiplier. The local oscillator includes a phase clock generator, a latch, and first through fourth conductors. The phase clock generator has an input for receiving a clock signal, and first and second outputs for providing an in-phase local oscillator signal and a quadrature local oscillator signal, respectively. The first and second conductors are coupled to the first and second outputs of the phase clock generator. The latch has first and second input terminals respectively coupled to the first and second conductors, a clock input terminal for receiving the clock signal, and first and second output terminals. The third and fourth conductors are respectively coupled to the first and second output terminals of the latch. The multiplier has a first input for receiving an input signal, a second input coupled to the third conductor for receiving the in-phase local oscillator signal, a third input coupled to the fourth conductor for receiving the quadrature local oscillator signal, a first output for providing an in-phase mixed signal, and a second output for providing a quadrature mixed signal. The third and fourth conductors are characterized as having lower impedances than the first and second conductors.

In another form a method of mixing an input signal with a local oscillator signal is provided. An in-phase local oscillator signal and a quadrature local oscillator signal are generated in response to a clock signal. The in-phase local oscillator signal and the quadrature local oscillator signal are transmitted over first and second conductors, respectively. The in-phase local oscillator signal and the quadrature local oscillator signal are resynchronized using the clock signal to provide a resynchronized in-phase local oscillator signal and a resynchronized quadrature local oscillator signal. The resynchronized in-phase local oscillator signal and resynchronized quadrature local oscillator signal are transmitted over third and fourth conductors to inputs of a multiplier. The third and fourth conductors have lower impedances than the first and second conductors, respectively.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
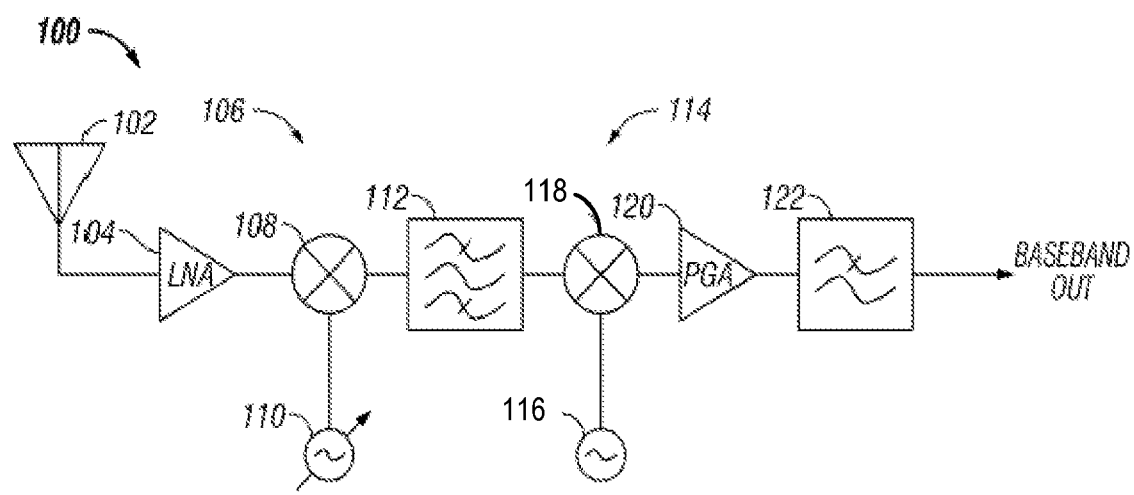
FIG. 1 illustrates in partial block diagram and partial schematic form a radio receiver according to the present invention.

FIG. 1 illustrates in partial block diagram and partial schematic form a radio receiver 100 according to the present invention. Receiver 100 is a dual-superheterodyne receiver that includes generally an antenna 102, a low noise amplifier labeled "LNA" 104, an RF to IF mixer 106, a bandpass filter 112, image rejecting mixer 114 a programmable gain amplifier labeled "PGA" 120, and a lowpass filter 122. Amplifier 104 has an input terminal connected to antenna 102, and an output terminal, and amplifies a broadband signal received on antenna 102 to provide an amplified signal to the output terminal thereof. Mixer 106 mixes the amplified signal to IF as follows. Mixer 106 includes a multiplier 108 and a tunable oscillator 110. Multiplier 108 has a first input terminal connected to the output terminal of amplifier 104, a second input terminal, and an output terminal. Tunable oscillator 110 has a tuning input terminal and an output terminal that provides an RF local oscillator (LO) signal. The RF LO signal is selected by the tuning input to have a frequency such that a desired channel is mixed from RF to a selected IF, which is also the center frequency of bandpass filter 112. Bandpass filter 112 has an input terminal connected to the output terminal of multiplier 108, and an output terminal for providing an output signal with significant signal energy in a passband centered around the chosen IF, and with significant attenuation of signal energy in a stopband outside the passband.

This signal at the output of bandpass filter 112 is then mixed to baseband in image rejecting mixer 114. Image rejecting mixer 114 includes a multiplier 118 and an oscillator 116. Multiplier 118 has a first input terminal connected to the output terminal of bandpass filter 112, a second input terminal, and an output terminal. Multiplier 114 further includes a polyphase filter for rejecting an image frequency, as will be described more fully below. Oscillator 116 provides an IF LO signal at an output terminal thereof. The IF LO signal is selected to have an output frequency chosen to mix the selected IF signal to baseband, and multiplier 118 thus provides the output signal thereof at baseband. Amplifier 120 is provided to amplify this signal to a desired level, and has an input terminal connected to the output terminal of multiplier 118, and an output terminal. Filter 122 has an input terminal connected to the output terminal of amplifier 120, and an output terminal for providing an output signal of receiver 100 labeled "BASEBAND OUT".

Receiver 100 is a dual-superheterodyne receiver with an image rejecting mixer. In order to attenuate a relatively large band of image frequencies, image rejecting mixer 114 preferably uses a polyphase filter, not shown in FIG. 1, such as the one described in copending application Ser. No. 10/814,615. The design of the oscillator 116 and multiplier 118 facilitates the image rejecting function of mixer 114 by producing differential in-phase and quadrature baseband signals with lower distortion due to improved phase clock accuracy and reduced susceptibility to gain mismatch. These features will be described more fully below but the polyphase filter will not.

Figure 2:
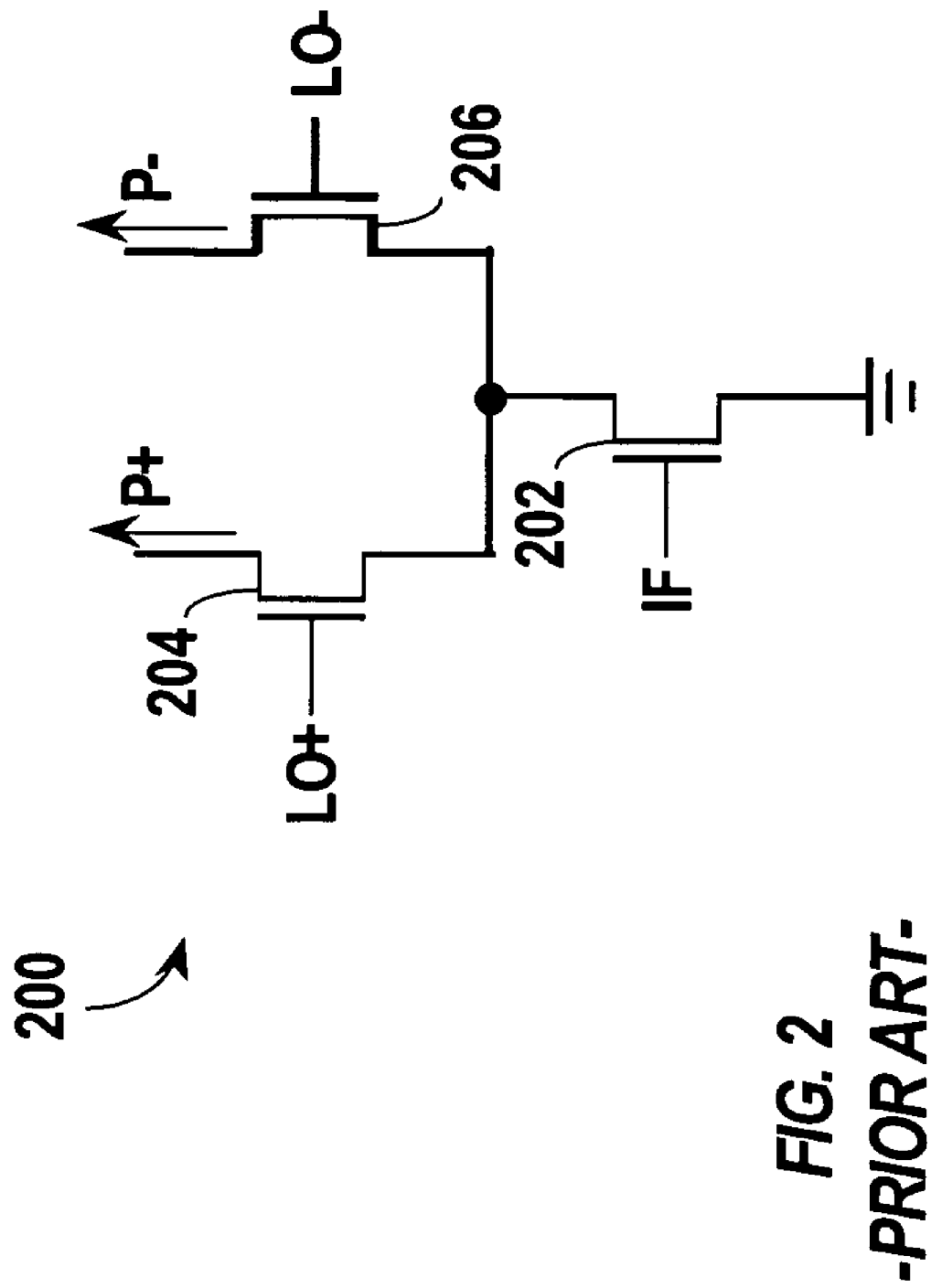
FIG. 2 illustrates in schematic form a portion of a mixer known in the prior art.

FIG. 2 illustrates in schematic form a portion 200 of a mixer known in the prior art. Mixer 200 includes three N-channel metal-oxide-semiconductor (MOS) transistors 202, 204, and 206. Note that a transistor having an insulated silicon gate is also conventionally considered to be an "MOS transistor" even though it does not have a metal gate. Transistor 202 has a drain, a gate for receiving an input signal labeled "IF", and a source connected to a ground potential, typically at zero volts. Transistor 204 has a drain for providing a positive output current signal labeled "P+", a gate for receiving a positive local oscillator signal labeled "LO+", and a source connected to the drain of transistor 202. Transistor 206 has a drain for providing a negative output current signal labeled "P−", a gate for receiving a positive local oscillator signal labeled "LO−", and a source connected to the drain of transistor 202. Portion 200 forms what is referred to as a single balanced mixer, in which the input signal (which may be an intermediate frequency signal) is mixed with a local oscillator signal to form a differential in-phase current signal. In a typical mixer this circuitry will be replicated to form a differential quadrature current signal using an LO signal in quadrature with the LO+ and LO− signal. The single-balanced mixer is susceptible to distortion caused by phase error mismatch between transistors 204 and 206, as well as between transistor 202 and the corresponding transistor in the corresponding quadrature portion of the mixer.

Figure 3:
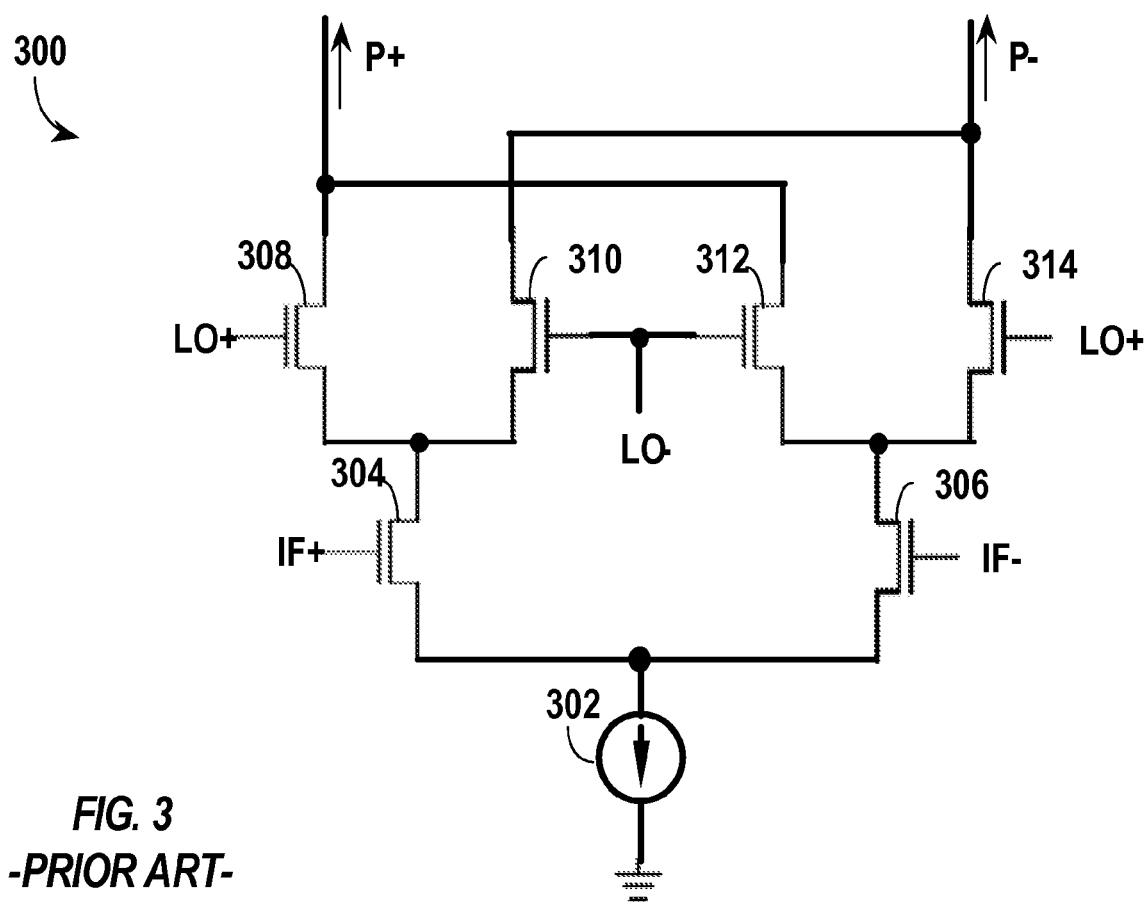
FIG. 3 illustrates in schematic form a portion of another mixer known in the prior art.

FIG. 3 illustrates in schematic form a portion 300 of another mixer known in the prior art. Portion 300 include a current source 302, and N-channel transistors 304, 306, 308, 310, 312, and 314. Current source 302 has a first terminal and a second terminal connected to ground. Transistor 304 has a drain, a gate for receiving IF+, and a source connected to the first terminal of current source 302. Transistor 306 has a drain, a gate for receiving IF−, and a source connected to the first terminal of current source 302. Transistor 308 has a drain for providing current signal P+, a gate for receiving signal LO+, and a source connected to the drain of transistor 304. Transistor 310 has a drain for providing current signal P−, a gate for receiving signal LO−, and a source connected to the drain of transistor 304. Transistor 312 has a drain connected to the drain of transistor 308, a gate for receiving signal LO−, and a source connected to the drain of transistor 306. Transistor 314 has a drain connected to the drain of transistor 310, a gate for receiving signal LO+, and a source connected to the drain of transistor 306.

Portion 300 forms what is referred to as a double balanced mixer or Gilbert cell, in which the differential input signal is mixed with a differential local oscillator signal to form a differential in-phase current signal. Like the single balanced case, this circuitry may be replicated to form a differential quadrature current signal using a quadrature local oscillator signal. Transistors 304 and 306 selectively divert the current of current source 302 based on the differential input signal. Transistors 308, 310, 312, and 314 form a "chopper" circuit that "chops" the two portions of the differential current using the differential LO signal. Since each output current signal of the differential current pair, namely P+ and P−, are formed by chopping using both LO signals, they are less susceptible to distortion from phase error between the positive and negative components of the LO clock signal. However they are still susceptible to distortion caused by phase error between the in-phase LO signal and the quadrature LO signal. They are also susceptible to mismatch between transistors 304 and 306, as well as mismatch between the current sources 302 of the in-phase and quadrature mixers.

Figure 4:
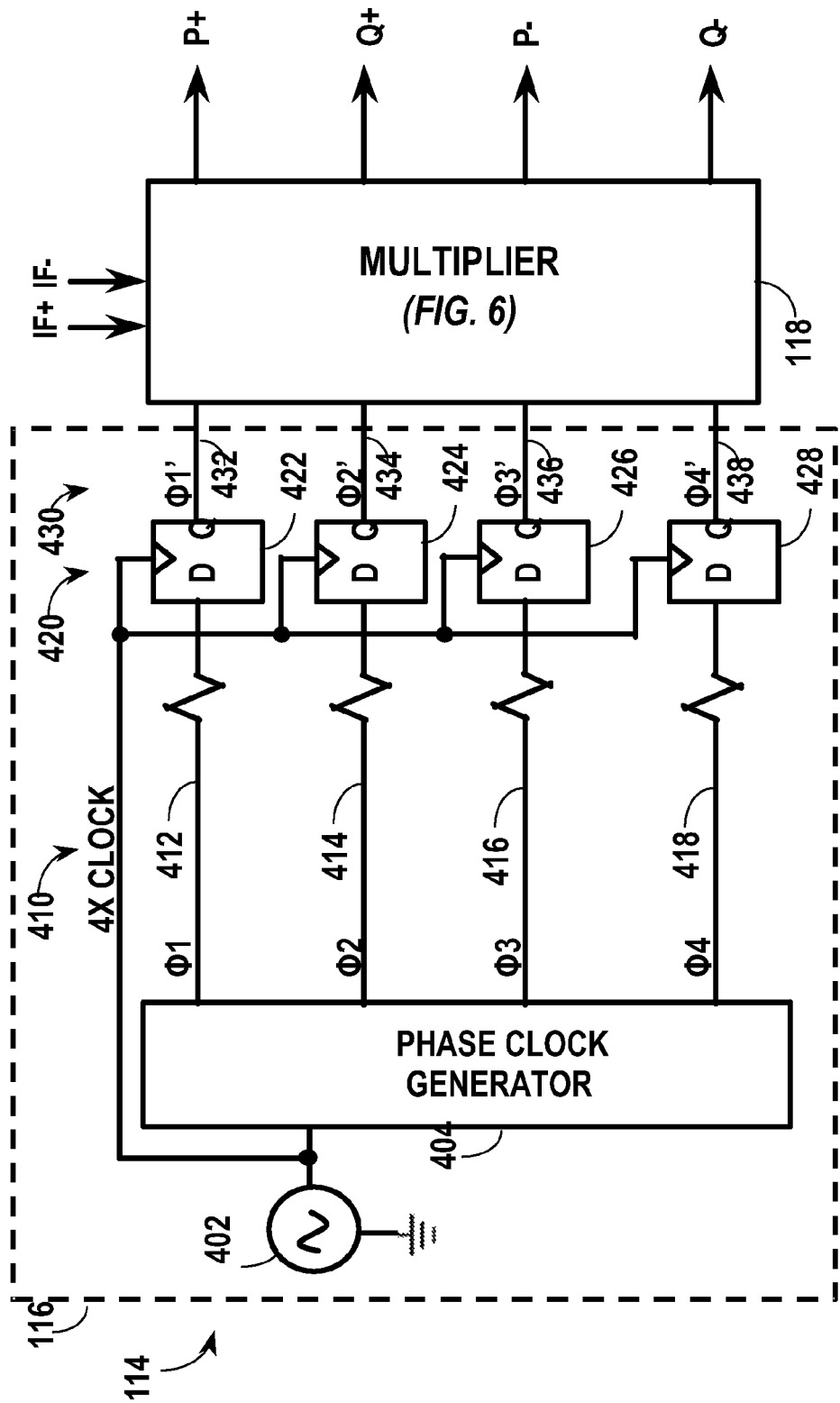
FIG. 4 illustrates in partial block diagram and partial schematic the mixer of FIG. 1.

FIG. 4 illustrates in partial block diagram and partial schematic mixer 114 of FIG. 1, including local oscillator 116 and multiplier 118. Local oscillator 116 includes generally an oscillator 402, a phase clock generator 404, a first set of conductors 410, a latch 420, and a second set of conductors 430. Oscillator 402 provides an output clock signal labeled "4X CLOCK" referenced to ground. Phase clock generator 404 has an input terminal for receiving the 4X CLOCK, and output terminals for providing four phase clock signals labeled "φ1", "φ2", "φ3", and "φ4". The phase clock signals are conducted on respective conductors 412, 414, 416, and 418, with phase clock generator 404 connected to a first end of the conductor and latch 420 connected to a second end.

Latch 420 includes D flip-flops 422, 424, 426, and 428. Flip-flop 422 has a D input terminal connected to the second end of conductor 412, a clock input terminal for receiving the 4X CLOCK, and a Q output terminal for providing a latched phase clock signal labeled "φ1'". Flip-flop 424 has a D input terminal connected to the second end of conductor 414, a clock input terminal for receiving the 4X CLOCK, and a Q output terminal for providing a latched phase clock signal labeled "φ2'". Flip-flop 426 has a D input terminal connected to the second end of conductor 416, a clock input terminal for receiving the 4X CLOCK, and a Q output terminal for providing a latched phase clock signal labeled "φ3'". Flip-flop 428 has a D input terminal connected to the second end of conductor 418, a clock input terminal for receiving the 4X CLOCK, and a Q output terminal for providing a latched phase clock signal labeled "φ4'". Conductors 430 include four conductors 432, 434, 436, and 438 each having a first end connected to the Q output terminals of latches 422, 424, 426, and 428, respectively, and a second end connected to corresponding input terminals of multiplier 118.

Multiplier 118 has four inputs connected to the second ends of conductors 432, 434, 436, and 438, a pair of signal input terminals for receiving IF+ and IF−, and four output terminals respectively providing baseband signals P+, Q+, P−, and Q−.

In order to improve phase clock accuracy, mixer 114 resynchronizes the phase clocks using the 4X CLOCK at a physical location on the integrated circuit near where the phase clocks are used, that is at multiplier 118. Latch 420 requires a relatively small amount of circuitry and it can be placed to reduce the length of conductors 430 as much as possible. An important feature is that the impedance of conductors 430 is less than the impedance of corresponding conductors 410. Note that this characteristic will generally mean that the length of conductors 430 will be shorter than the length of conductors 410. Note however that other factors contribute to the impedance such as total conductor area, dielectric (usually silicon dioxide or silicon nitride) spacing, etc. so that length is not the only determinant of impedance.

However all other factors aside it is important to reduce the length of conductors 430 as much as possible. Thus for example each individual D flip-flop in latch 420 might be laid out as a repeated cell in close proximity to multiplier 118. The uniformity in repeating the flip-flop cell layout may cause the length of conductors 430 to be somewhat above the theoretical minimum distance but it would be desirable to reduce it as much as practical to achieve the objective of reducing distortion. Also the lengths of each one of conductors 430 need to be made as nearly equal as possible.

In sum mixer 114 improves phase clock accuracy by reducing critical signal routing length of conductors 430 (therefore reducing the opportunity for differing propagation lengths and mismatched loading), decreasing the loading at the output of latch 420, and allowing the flip flops in latch 420 to be laid out so as to match their characteristics as nearly as possible.

Figure 5:
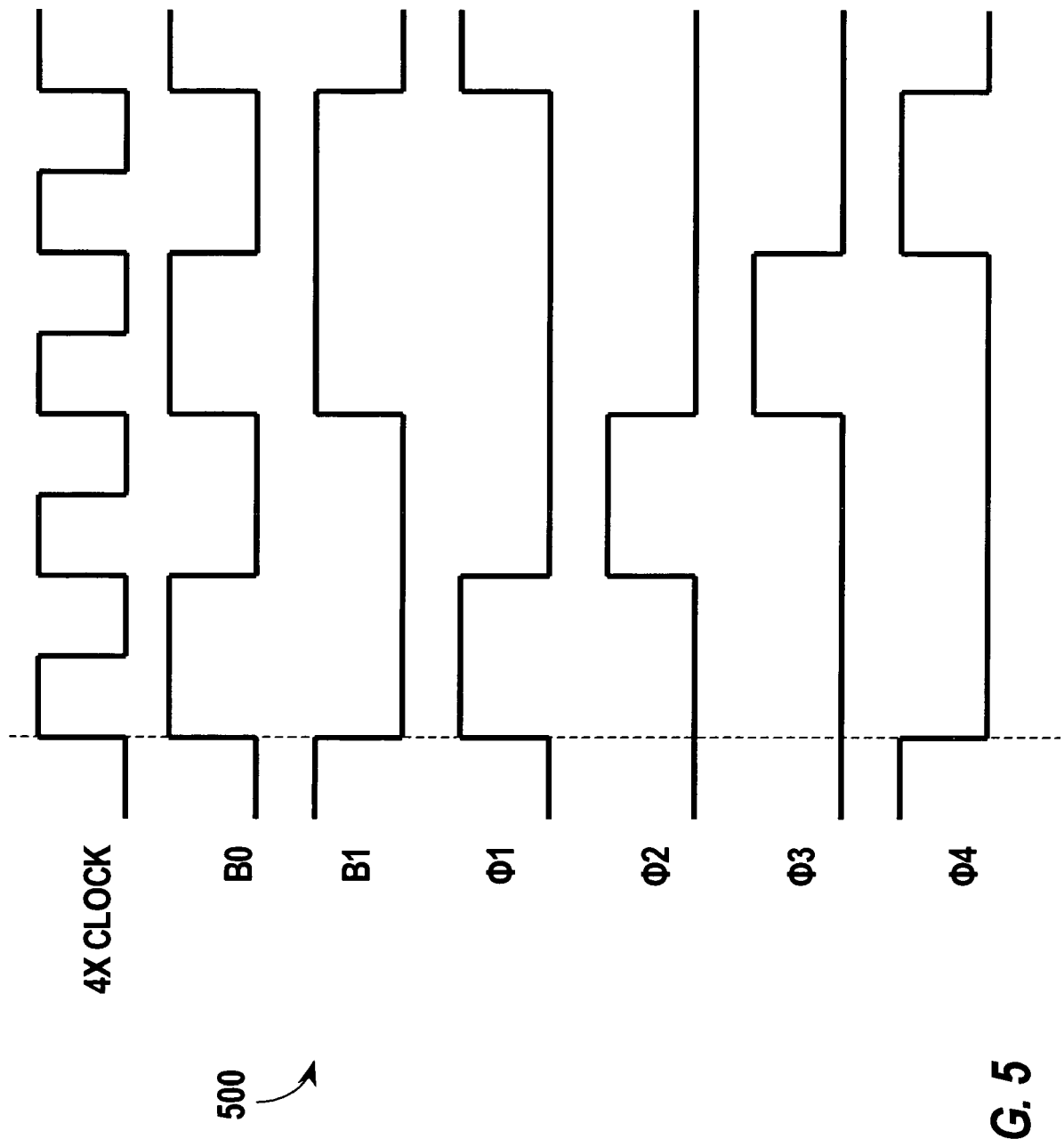
FIG. 5 illustrates a timing diagram for timing signals associated with the mixer of FIG. 4.

FIG. 5 illustrates a timing diagram 500 for timing signals associated with mixer 114 of FIG. 4. Timing diagram 500 illustrates the 4X CLOCK signal and the four phase clock signals φ1, φ2, φ3, and φ4. It also illustrates two signals labeled "B0" and "B1" that are used to generate the phase clock signals. B0 and B1 are the outputs of a binary counter (not shown in FIG. 4) that is part of phase clock generator 404 and that increments once for each cycle of the 4X CLOCK. Phase clock generator 404 generates the phase clock signals by performing logical operations on the counter outputs. Thus φ1 equals B0 and NOT B1; φ2 equals NOT B0 and NOT B1; φ3 equals B0 and B1; and φ4 equals NOT B0 and B1. Note that phase clock generator 404 may be implemented using other similar digital logic circuits.

Figure 6:
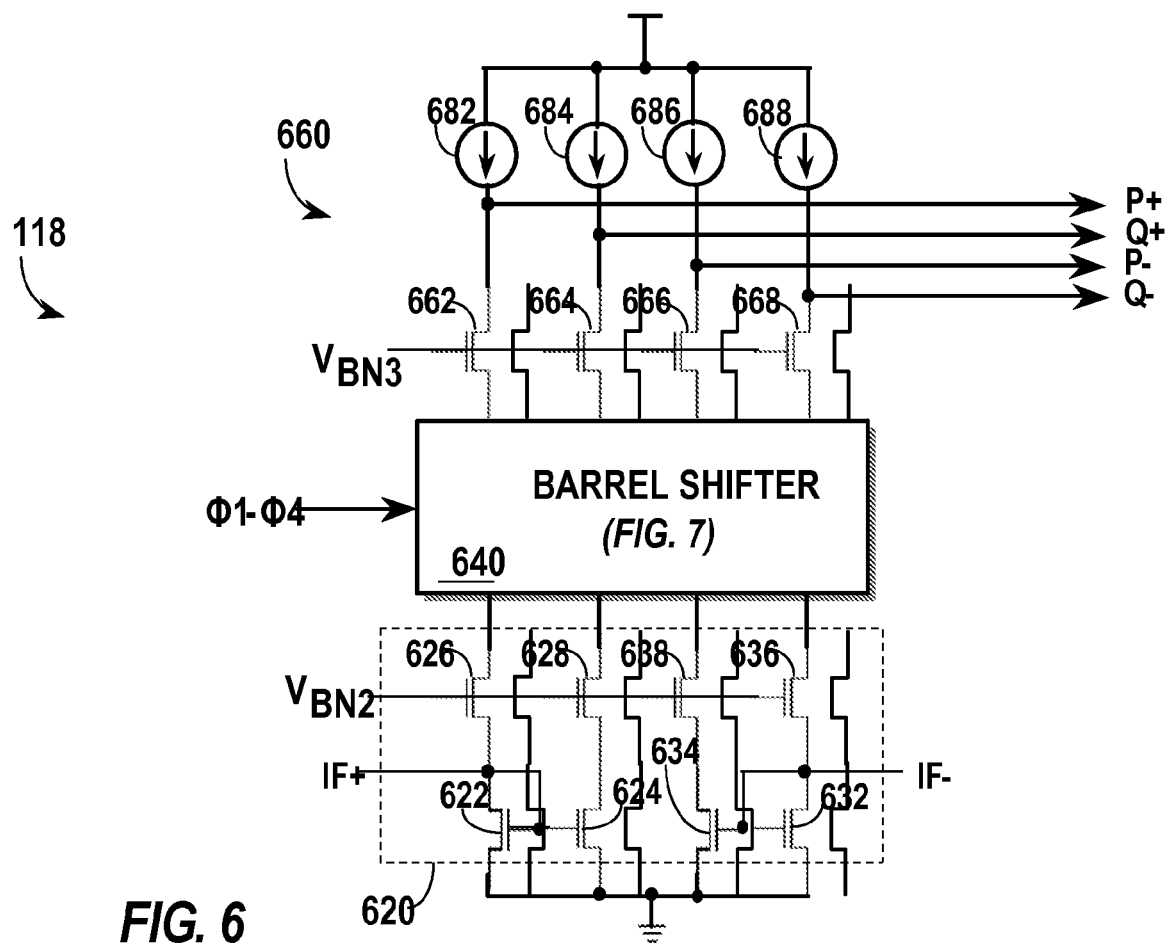
FIG. 6 illustrates in partial block diagram and partial schematic the multiplier of the mixer of FIG. 1.

FIG. 6 illustrates in partial block diagram and partial schematic multiplier 118 of mixer 114 of FIG. 1. Multiplier 118 includes generally a transconductance amplifier 620, a chopper circuit in the form of a barrel shifter 640, and a load circuit 660. Transconductance amplifier 620 includes N-channel MOS transistors 622, 624, 626, 628, 632, 634, 636, and 638. Transistor 622 has a drain and gate connected together and receiving signal IF+, and a source connected to ground. Transistor 624 has a drain, a gate connected to the drain and gate of transistor 622, and a source connected to ground. Transistor 626 has a drain for providing a negative current of a first differential input current pair, a gate for receiving a bias voltage labeled "VBN2", and a source connected to the drain of transistor 622. Transistor 628 has a drain for providing a positive current of the first differential input current pair, a gate for receiving bias voltage VBN2, and a source connected the drain of transistor 624. Transistor 632 has a drain and gate connected together and receiving signal IF−, and a source connected to ground. Transistor 634 has a drain, a gate connected to the drain and gate of transistor 632, and a source connected to ground. Transistor 636 has a drain for providing a positive current of a second differential input current pair, a gate for receiving bias voltage VBN2, and a source connected to the drain of transistor 632. Transistor 638 has a drain for providing a negative current of the second differential input current pair, a gate for receiving bias voltage VBN2, and a source connected to the drain of transistor 634.

Barrel shifter 620 has four input terminals respectively receiving the positive and negative currents of the first and second differential input current pairs, four clock input terminals for receiving clock signals ϕ1-ϕ4, and four output terminals connected to respective nodes for providing positive and negative currents of each of the first and second differential output current pairs.

Load circuit 660 includes four N-channel MOS transistors 662, 664, 666, and 668, and four current sources 682, 684, 686, and 688. Transistor 662 has a drain for providing an output voltage labeled "P+", a gate for receiving a bias voltage labeled "VNB3", and a source connected to the first node for receiving the negative current of the first differential output current pair. Transistor 664 has a drain for providing an output voltage labeled "Q+", a gate for receiving bias voltage VNB3, and a source connected to the second node for receiving the positive current of the first differential output current pair. Transistor 666 has a drain for providing an output voltage labeled "P−", a gate for receiving bias voltage VNB3, and a source connected to the third node for receiving the positive current of the second differential output current pair. Transistor 668 has a drain for providing an output voltage labeled "Q−", a gate for receiving bias voltage VNB3, and a source connected to the fourth node for receiving the negative current of the second differential output current pair. Current source 682 has a first terminal connected to a positive power supply voltage terminal, and a second terminal connected to the drain of transistor 662. Current source 684 has a first terminal connected to the positive power supply voltage terminal, and a second terminal connected to the drain of transistor 664. Current source 686 has a first terminal connected to the positive power supply voltage terminal, and a second terminal connected to the drain of transistor 666. Current source 688 has a first terminal connected to the positive power supply voltage terminal, and a second terminal connected to the drain of transistor 668.

In operation, transconductance amplifier 620 provides a linear input impedance and a linear differential output current. The linear input impedance is formed using two stacked pairs of N-channel MOS transistors, 622/626 and 632/636, operating in saturation and strong inversion. Transistors 622 and 632 are diode connected and cascode transistors 626 and 636 are biased with a constant bias voltage VBN2. Each of two additional pairs of transistors 624/628 and 634/638 forms a current mirror with their respective diode-connected transistors. The differential currents formed thereby are linear with respect to the input voltage. The linear input impedance helps the receiver IC operate with an impedance-sensitive external SAW filter.

More specifically, it can be demonstrated that the differential output current is linear with respect to the input voltage and the impedance is fixed and can be controlled to match the desired output impedance of the SAW filter. If $I_{D622}$ represents the drain current of transistor 622, then its value is given by the expression:

$$I_{D622} = \beta_{622}(V_{IF+} - V_T)^2 \quad [1]$$

where $V_{IF+}$ is the voltage of signal IF+, $V_T$ is the threshold of transistor 622, and $\beta_{622}$ is a constant based on the physical and process characteristics of transistor 622. Likewise if $I_{D626}$ represents the drain current of transistor 626, then its value is given by the expression:

$$I_{D626} = \beta_{626}[(V_{BN2} - V_{IF+}) - V_T]^2 \quad [2]$$

Now if VBN2 and $V_{IN}$ are defined to be set as follows:

$$V_{BN2} = 2V_T + 2V_{ON} \quad [3]$$

and $$V_{IF+} = V_T + V_{ON} + V_I \quad [4]$$

where $V_{ON}$ is a constant and $V_I$ is the input signal relative to $(V_T + V_{ON})$, then $$I_{D622} = \beta_{622}(V_{ON} + V_I)^2 \quad [5]$$

and $$I_{D626} = \beta_{626}(V_{ON} - V_I)^2 \quad [6]$$

We know that transistors 622 and 626 are matched in size, so we can define $\beta = \beta_{622} = \beta_{626}$. If the input current $I_{IN}$ is defined as the current output from the SAW filter, then $$\begin{aligned} I_{IN} &= I_{D622} - I_{D626} \quad [7] \\ &= \beta(V_{ON}^2 + 2V_I V_{ON} + V_I^2) - \beta(V_{ON}^2 - 2V_I V_{ON} + V_I^2) \\ &= 4\beta V_I V_{ON} \end{aligned}$$

which is linear with respect to input voltage. The input impedance $Z_{IN}$ is given by:

$$Z_{IN} = \frac{V_I}{I_{IN}} = \frac{1}{4\beta V_{ON}}$$

which is constant and controllable. The first differential input current $I_{DIFF1}$ is given by $$I_{OUT} = I_{D628} - I_{D626} = I_{D626} - I_{D622} = -4\beta V_I V_{ON} \quad [9]$$

since $I_{D628} = I_{D624} = I_{D622}$. It should be clear that the second differential input current $I_{DIFF2}$ is derived similarly and the other portion of transconductance amplifier 620 receiving signal IF− will have the same properties of constant input impedance and linear differential output current. Note that transistors 622, 624, 626 and 628 will all have the same sizes in order to generate symmetrical differential input currents. Likewise transistors 632, 634, 636, and 638 will all have the same sizes.

The linear differential output current allows the use of a special chopper circuit (barrel shifter 640) that has further advantageous properties. Barrel shifter 640 compensates for phase clock error by switching currents forming both in-phase and quadrature output signals using the same set of clock signals, substantially canceling the effect of this phase clock error.

Figure 7:
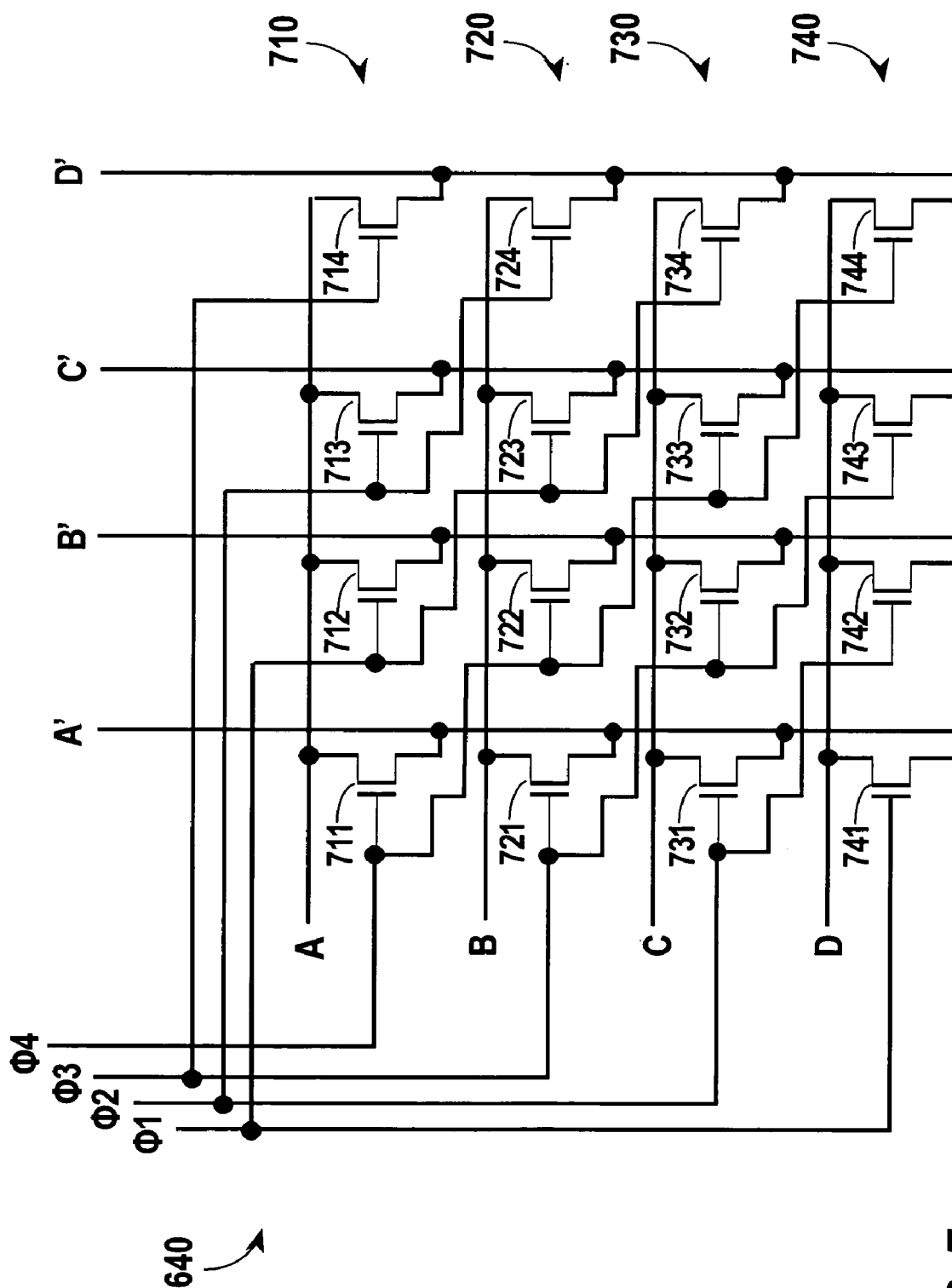
FIG. 7 illustrates in schematic form the barrel shifter of FIG. 6.

The operation of the barrel shifter is better understood with reference to FIG. 7, which illustrates in schematic form barrel shifter 640 of FIG. 6. Barrel shifter 640 includes four input nodes labeled "A", "B", "C", and "D" for receiving positive and negative input currents of first and second differential input current pairs, and four output nodes labeled "A'", "B'", "C'" and "D'" into which barrel shifter 640 provides positive and negative output currents of first and second differential output current pairs. Barrel shifter 640 includes generally four rows of transistors 710, 720, 730, and 740. Row 710 includes N-channel MOS transistors 711, 712, 713, and 714 each having a source connected to the A input node, gates for receiving respective ones of signals φ4, φ1, φ2, and φ3, and drains connected to respective ones of output nodes A', B', C', and D'. Row 720 includes N-channel MOS transistors 721, 722, 723, and 724 each having a source connected to the B input node, gates for receiving respective ones of signals φ3, φ4, φ1, and φ2, and drains connected to respective ones of output nodes A', B', C', and D'. Row 730 includes N-channel MOS transistors 731, 732, 733, and 734 each having a source connected to the C input node, gates for receiving respective ones of signals φ2, φ3, φ4, and φ1, and drains connected to respective ones of output nodes A', B', C', and D'. Row 740 includes N-channel MOS transistors 741, 742, 743, and 744 each having a source connected to the D input node, gates for receiving respective ones of signals φ1, φ2, φ3, and φ4, and drains connected to respective ones of output nodes A', B', C', and D'.

Barrel shifter 640 improves mixer gain matching over known chopper circuits by rotating the transistors used to chop each input current. Thus if one transistor caused gain mismatch relative to other transistors, it would be used to chop the input current only one-fourth of the time. Barrel shifter 640 also drives each output current using all four phase clock signals. Since such a phase clock error will distort both the positive and negative components of the differential in-phase or quadrature current pair in the same way, the effect will tend to be cancelled.

Returning now to FIG. 6, load circuit 660 converts the differential output current pairs at the output of barrel shifter 640 into corresponding differential voltage pairs. Cascode transistors 662, 664, 666, and 668 are biased by constant bias voltage VBN3 and reduce the voltage swing on cascode transistors 626, 628, 636, and 638, thereby improving linearity. Furthermore they also reduce the coupling of switching noise to the outputs.

Note that one of ordinary skill in the art will readily be able to construct an analogous P-channel MOS transconductance stage according to the principles described above. Also the various components of mixer 114 can be used together or in various combinations with known mixer circuits. Furthermore various polyphase filter designs are suitable for use in mixer 114. Mixer 114 uses the polyphase filter to pass the upper sideband and attenuate the lower sideband of the desired signal. However mixer 114 may be altered to pass the lower sideband and attenuate the upper sideband by simply reversing the sequence of clocks φ1-φ4, for example by swapping clocks φ1 and φ3 (or φ2 and φ4). Known mixers require that one of the LO clocks (in-phase or quadrature) be inverted to change the selected sideband.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A mixer comprising:
   a phase clock generator for providing a plurality of phase clock signals;
   a latch coupled to said phase clock generator via a first plurality of conductors and providing a plurality of resynchronized phase clock signals; and
   a multiplier coupled to said latch via a second plurality of conductors for mixing an input signal using said plurality of resynchronized phase clock signals to provide a mixed output signal, wherein said second plurality of conductors is characterized as having a lower end-to-end impedance than an end-to-end impedance of said first plurality of conductors.

2. The mixer of claim 1 wherein said latch latches said plurality of phase clock signals to provide said plurality of resynchronized phase clock signals in synchronism with a clock signal.

3. The mixer of claim 2 wherein said phase clock generator provides said plurality of phase clock signals in response to said clock signal.

4. The mixer of claim 3 further comprising:
   an oscillator having an output for providing said clock signal.

5. The mixer of claim 2 wherein each of said plurality of phase clock signals has a frequency equal to one-fourth of a frequency of said clock signal.

6. The mixer of claim 1 wherein said plurality of phase clock signals comprises an in-phase signal and a quadrature signal.

7. The mixer of claim 6 wherein said plurality of phase clock signals further comprises a first phase base clock signal comprising a phase-shifted representation of said in-phase signal and a second phase clock signal comprising a phase-shifted representation of said quadrature signal.

8. A mixer comprising:
   a phase clock generator having an input terminal for receiving a clock signal and an output terminal for providing a plurality of phase clock signals in response to said clock signal;
   a first plurality of conductors for conducting said plurality of phase clock signals;
   a latch having a plurality of data input terminals coupled to corresponding ones of said first plurality of conductors, a clock input terminal for receiving said clock signal, and a plurality of output terminals for providing a plurality of resynchronized phase clock signals;
   a second plurality of conductors for conducting said plurality of resynchronized phase clock signals wherein said second plurality of conductors is characterized as having a lower impedance than said first plurality of conductors; and
   a multiplier having a first input terminal for receiving an input signal, a plurality of second input terminals for receiving said plurality of resynchronized phase clock signals, and an output terminal for providing a mixed output signal.

9. The mixer of claim 8 further comprising:
an oscillator having an output for providing said clock signal.

10. The mixer of claim 8 wherein said plurality of phase clock signals comprises an in-phase signal and a quadrature signal.

11. The mixer of claim 10 wherein said plurality of phase clock signals further comprises a first phase clock signal comprising a phase-shifted representation of said in-phase signal and a second phase clock signal comprising a phase-shifted representation of said quadrature signal.

12. The mixer of claim 8 wherein each of said plurality of phase clock signals has a frequency equal to one-fourth of a frequency of said clock signal.

13. A mixer comprising:
a local oscillator comprising;
  a phase clock generator having an input for receiving a clock signal, and first and second outputs for providing an in-phase local oscillator signal and a quadrature local oscillator signal, respectively;
  first and second conductors coupled to said first and second outputs of said phase clock generator;
  a latch having first and second input terminals respectively coupled to said first and second conductors, a clock input terminal for receiving said clock signal, and first and second output terminals;
  third and fourth conductors respectively coupled to said first and second output terminals of said latch; and
a multiplier having a first input for receiving an input signal, a second input coupled to said third conductor for receiving said in-phase local oscillator signal, a third input coupled to said fourth conductor for receiving said quadrature local oscillator signal, a first output for providing an in-phase mixed signal, and a second output for providing a quadrature mixed signal,
wherein said third and fourth conductors are characterized as having lower impedances than said first and second conductors.

14. The mixer of claim 13 wherein local oscillator further comprises:
an oscillator having an output for providing said clock signal.

15. The mixer of claim 13 wherein said third and fourth conductors are characterized as being shorter than said first and second conductors.

16. A method of mixing an input signal with a local oscillator signal comprising the steps of:
generating an in-phase local oscillator signal and a quadrature local oscillator signal in response to a clock signal;
transmitting said in-phase local oscillator signal and said quadrature local oscillator signal over first and second conductors, respectively;
resynchronizing said in-phase local oscillator signal and said quadrature local oscillator signal using said clock signal to provide a resynchronized in-phase local oscillator signal and a resynchronized quadrature local oscillator signal; and
transmitting said resynchronized in-phase local oscillator signal and said resynchronized quadrature local oscillator signal over third and fourth conductors to inputs of a multiplier, said third and fourth conductors having lower impedances than said first and second conductors, respectively.

17. The method of claim 16 further comprising the step of:
multiplying the input signal by said resynchronized in-phase local oscillator signal and said resynchronized quadrature local oscillator signal to provide a mixed output signal.

* * * * *